(12) United States Patent
Pham et al.

(10) Patent No.: US 9,087,702 B2
(45) Date of Patent: Jul. 21, 2015

(54) EDGE COUPLING OF SEMICONDUCTOR DIES

(71) Applicant: Freescale Semiconductor, Inc., Austin, TX (US)

(72) Inventors: Tim V. Pham, Austin, TX (US); Michael B. McShane, Austin, TX (US); Perry H. Pelley, Austin, TX (US); Andrew C. Russell, Austin, TX (US); James R. Guajardo, Georgetown, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/017,867

(22) Filed: Sep. 4, 2013

(65) Prior Publication Data

US 2015/0061097 A1 Mar. 5, 2015

(51) Int. Cl.
*H01L 23/48* (2006.01)
*H01L 23/00* (2006.01)

(52) U.S. Cl.
CPC ............... *H01L 24/06* (2013.01); *H01L 24/89* (2013.01)

(58) Field of Classification Search
CPC ........... H01L 2924/01078; H01L 2924/01079; H01L 2924/01029; H01L 2924/01013; H01L 24/06; H01L 24/89; H01L 2924/14
USPC ......... 257/777, 686, 685, 787, 788, 778, 666, 257/737, 738
See application file for complete search history.

(56) References Cited

U.S. PATENT DOCUMENTS

| | | | |
|---|---|---|---|
| 6,603,072 B1 | 8/2003 | Foster et al. | |
| 6,611,050 B1 | 8/2003 | Ference et al. | |
| 8,110,905 B2 | 2/2012 | Park et al. | |
| 8,310,259 B2 | 11/2012 | Hamel et al. | |
| 8,338,945 B2 | 12/2012 | Yu et al. | |
| 8,344,512 B2 | 1/2013 | Knickerbocker | |
| 2010/0013108 A1* | 1/2010 | Gibson et al. | 257/777 |
| 2011/0227207 A1 | 9/2011 | Yilmaz et al. | |
| 2012/0266684 A1 | 10/2012 | Hooper et al. | |
| 2012/0326334 A1 | 12/2012 | Sakaguchi | |
| 2013/0026612 A1 | 1/2013 | Lu et al. | |
| 2013/0026643 A1 | 1/2013 | England et al. | |
| 2013/0070438 A1 | 3/2013 | Choi et al. | |

* cited by examiner

*Primary Examiner* — Hoa B Trinh
(74) *Attorney, Agent, or Firm* — Luiz von Paumgartten; Fogarty, L.L.C.

(57) ABSTRACT

Edge coupling of semiconductor dies. In some embodiments, a semiconductor device may include a first semiconductor die, a second semiconductor die disposed in a face-to-face configuration with respect to the first semiconductor die, and an interposer arranged between the first semiconductor and second semiconductor dies, the interposer having an edge detent configured to allow an electrical coupling between the first and second semiconductor dies. In other embodiments, a method may include coupling a first semiconductor die to a surface of an interposer where an edge of the interposer includes detents and the first semiconductor die includes a first pad aligned with a first detent, coupling a second semiconductor die to an opposite surface of the interposer where the first and second semiconductor dies are in a face-to-face configuration and the second semiconductor die includes a second pad aligned with a second detent, and coupling the first and second pads together.

11 Claims, 8 Drawing Sheets

EDGE COUPLING OF SEMICONDUCTOR DIES

FIELD

This disclosure relates generally to semiconductors, and more specifically, to edge coupling of semiconductor dies.

BACKGROUND

In packaging integrated circuits, it is desirable to provide a package that allows for multiple semiconductor die within the package. There are several advantages to including multiple die within one package. For example, packaging costs can be reduced and the amount of space required on a printed circuit board can be reduced. One way to accommodate multiple die within a package is to stack one die on top of another die. However, one problem with the stacked die solution is providing electrical interconnections between dies. To address these, and other problems, the inventors hereof have developed fabrication and assembly processes that enable the stacking and connecting of multiple die while reducing interconnection length and package volume per die.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein are systems and methods for interconnecting semiconductor dies to each other using edge coupling(s). In some embodiments, edge coupling of semiconductor dies may allow a chain of face-to-face die stacks and/or arrays to be connected to one another. For example, a module may include two die—e.g., a top die and a bottom die—mounted in a face-to-face configuration, the two die interconnected at the edge of the module. An interposer (e.g., a passive interposer, a lead frame, etc.) with notches or detents may be disposed between the two die and may be configured to capture solder spheres or the like that provide electrical coupling between a pad on the top die and another pad on the bottom die.

In some cases, an interconnect pin-out (e.g., in a memory, etc.) may be designed such that it remains aligned in the same location after face-to-face bonding of the semiconductor dies. As such, in some implementations, these various systems and methods may be useful for stacking and connecting multiple memory die while reducing interconnection length and minimizing package volume per die.

Figure 1:
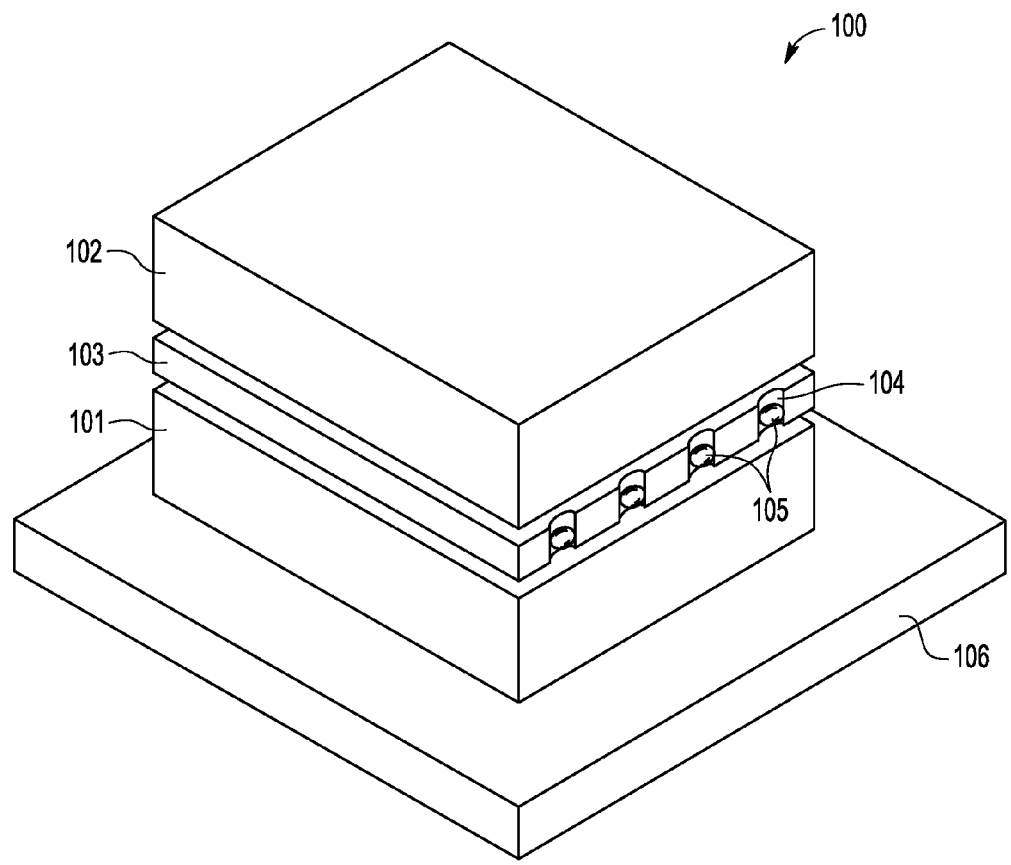
FIG. 1 is a three-dimensional, perspective view of an example of edge coupled semiconductor dies forming a module, according to some embodiments.

FIG. 1 is a three-dimensional, perspective view of an example of edge coupled semiconductor dies forming module 100 according to some embodiments. As shown, second semiconductor die 102 is disposed in a face-to-face configuration with respect to first semiconductor die 101. Interposer 103 is arranged between first semiconductor die 101 and second semiconductor die 102, and includes a plurality of edge detents 104 configured to allow an electrical coupling between dies 101 and 102 with solder spheres 105.

Semiconductor dies 101 and 102 are said to be in a face-to-face configuration because the active surface of die 101— that is, the surface upon which electronic components have been fabricated—faces the active surface of die 102. Generally speaking, dies 101 and 102 may be any type of integrated circuit, semiconductor device, or other type of electrically active substrate. For example, in some implementations, die 101 and die 102 may each include memory circuit(s), memory cells, or the like. Also, in some cases, die 101 and die 102 may each have the same circuit layout or topography.

It should be noted that internal traces and/or vias (not shown) within semiconductor die 101 may selectively interconnect electrical circuits within die 101. Similarly, internal traces and/or vias within semiconductor die 102 may selectively interconnect electrical circuits within die 102.

As illustrated, first semiconductor die is disposed upon substrate 106. Substrate 106 may have a variety of forms including a stamped lead frame, a ceramic substrate, a printed circuit board substrate, etc. Substrate 106 may also include internal metal layers or the like (not shown). In other cases, however, substrate 106 may be absent.

Electrical circuits located on die 101 may be coupled to other electrical circuits of die 102 via edge couplings formed through edge detents 104 of interposer 103. Interposer 103 may, in some embodiments, be a passive interposer; that is, interposer 103 may itself be a mechanical "spacer" devoid of electrical circuits. For instance, interposer 103 may include silicon, glass, ceramic, or any other suitable dielectric material. In other embodiments, interposer 103 may be an active interposer, such as a lead frame, a dielectric substrate or the like containing one or more electrical circuits, buses, conductive traces, etc.

In some implementations, interposer 103 may have a temperature expansion coefficient similar to that of dies 101 and 102 to allow for thermal expansion and contraction without damaging solder spheres 105 or other elements. Solder spheres 105 may include any suitable solder material, such as, for example, alloys including tin, lead, silver, copper, nickel, germanium, and/or zinc.

Figure 2:
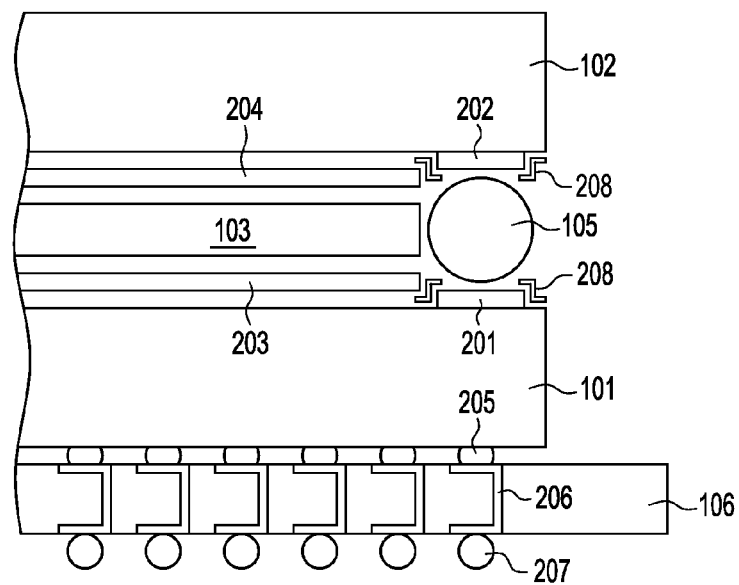
FIG. 2 is a cross-sectional view of an example of edge-coupled semiconductor dies, according to some embodiments.

FIG. 2 is a cross-sectional view of an example of edge coupled semiconductor dies according to some embodiments. First semiconductor die 101 is mounted on substrate 106, and is arranged in a face-to-face configuration with respect to second semiconductor die 102. Interposer 103 is attached to first semiconductor die 101 via tape or adhesive layer 203, and to second semiconductor die via tape or adhesive layer 204. Die 101 includes first pad or terminal 201, and die 202 includes second pad or terminal 102. Solder sphere 105 is deposited into edge detent 104 of interposer 103, thus electrically coupling pad 201 to pad 202 at the edges of dies 101 and 102, respectively. In some cases, passivation layer(s) 208 may be formed on pads 201 and 202. Also, in some embodiments, electrical connections may pass through interposer 103.

In the embodiments shown in FIGS. 1 and 2, it is noted that die 101 has approximately the same surface area as die 102. In other embodiments, however, die 102 may have a smaller surface than die 101. In those situations, pad 201 of die 101 may be located away from the edge of that die and closer to its center, whereas pad 202 may remain at or near the edge of die 102.

In some cases, to create external connections, for example, first semiconductor die 101 may be coupled to substrate 106 such that external pads 205 are coupled to conductive interconnects 206. Connective interconnects 206 may in turn be coupled to electrical terminals 207. In some cases, connections to the backside of die 101 with external pads 205 may be made with Through Silicon Vias (TSVs). For instance, connection from external pads 205 to connective interconnects 206 may be made with solder spheres or the like. As previously noted, however, in many situations substrate 106, external pads 205, and/or electrical terminals 207 may be absent.

In various embodiments, any suitable die attach processes, solder sphere reflow processes, and tape processes may be used in the formation of module 100. Die attach materials may be any type of appropriate material, such as, for example, adhesive tape or non-solid adhesive (e.g., glue, epoxy, etc.). Also, other embodiments may have any number of dies packaged within an electronic device, as discussed in more detail below.

Figure 3:
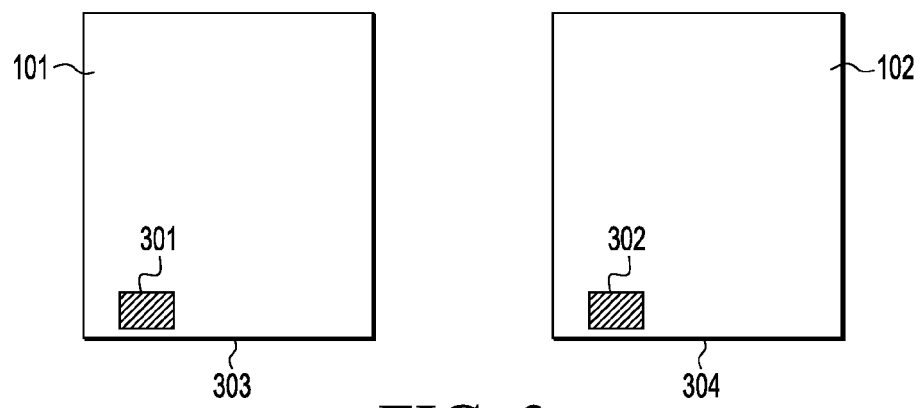
FIGS. 3-5 are diagrams illustrating examples of two semiconductor dies being assembled in a face-to-face configuration, according to some embodiments.
Figure 4:
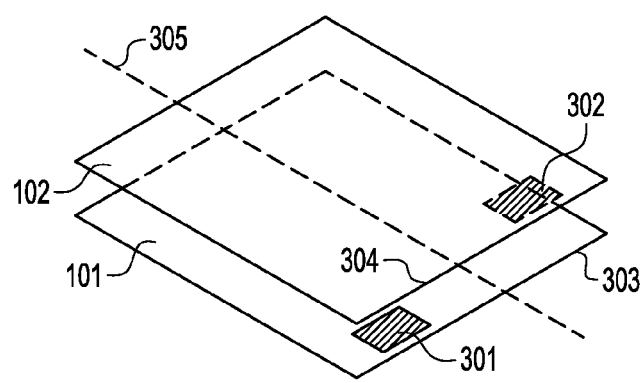
Figure 5:
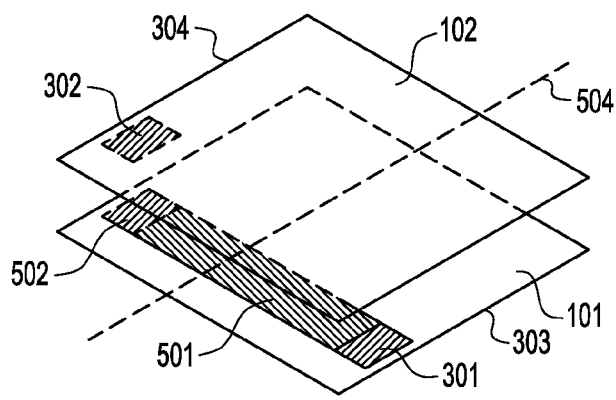

FIGS. 3-5 are diagrams illustrating examples of two semiconductor dies being assembled in different face-to-face configurations according to some embodiments. Particularly, FIG. 3 shows an active surface of first semiconductor die 101 and an active surface of second semiconductor die 102 side by side, each having the same topology—e.g., die 101 includes pad 301 at a given location along edge 303, and die 102 includes pad 302 in that same location along edge 304. Assume, in this example, that pads 301 and 302 are to be coupled together, for instance, to form a common node, to create an electrical bus, to receive/transmit a signal, etc. For example, first and second semiconductor dies 101 and 102 may be stacked together to form a memory module such as a dynamic random-access memory (DRAM) module, a static random-access memory (SRAM) module, or the like.

FIG. 4 illustrates the results of placing dies 101 and 102 in a first face-to-face configuration such that die 102 is flipped upside down over die 101. In this embodiment, as in FIG. 3, pad 301 is located along edge 303 of die 101 and pad 302 is located along edge 304 of die 102. However, the location of pad 302 is now a mirror image of pad 301 with respect to axis 305, which is perpendicular to edge 303. As such, it may be noted that pads 301 and 302 are not vertically aligned with respect to each other. In some cases, if there are additional pads along sides 303 or 304 of dies 101 and/or 102 (not shown) that need to be coupled together, certain pads may get in the way of other pads during interconnect operations.

FIG. 5 illustrates the results of placing dies 101 and 102 in a second face-to-face configuration such that die 102 is flipped upside down, but also rotated 180° with respect to die 101. In this embodiment, the location of pad 302 is a mirror image of the location of pad 301 with respect to axis 504, which is parallel to edge 303, and such that edge 304 of die 102 is vertically aligned with edge 503 of die 101.

As previously noted, in some embodiments, interposer 103 may be a lead frame and therefore may include circuits configured to couple pad 301 to pad 302 at opposite edges. These types of interposers are discussed in more detail below. In other embodiments, however, interposer 103 may be a passive interposer, and redistribution bus 501 may be fabricated on the surface of die 101 to relocate original pad 301 to pad area 502 immediately below corresponding pad 302 of die 102.

In some cases, redistribution bus 501 may be part of a redistribution layer of die 101 configured to relocate two or more pads such that, when die 101 is arranged in a face-to-face configuration with respect to die 102, pads of die 101 may be coupled to corresponding pads or areas of die 102. Additionally or alternatively, redistribution bus 501 may be manufactured on a surface of interposer 103. In various implementations, redistribution bus 501 may include any suitable conductive material such as copper, aluminum, or the like.

Figure 6:
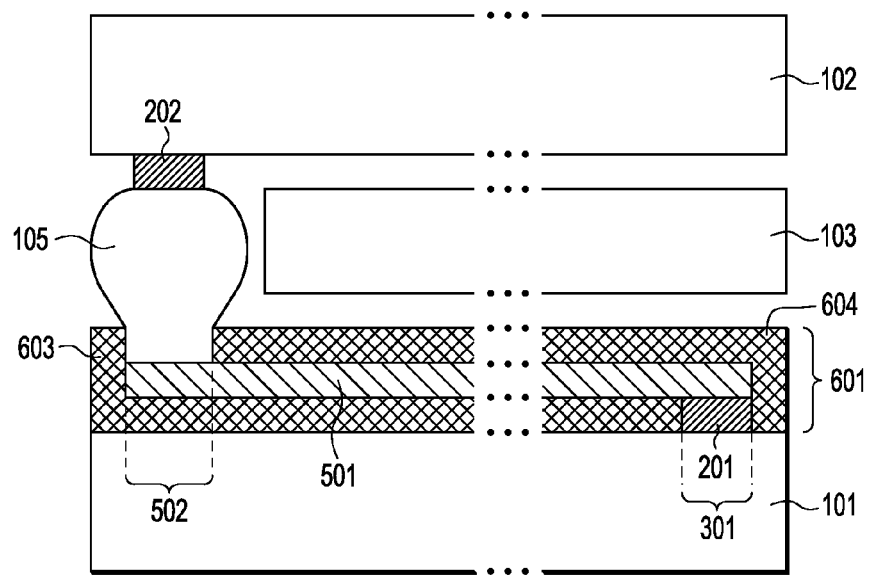
FIG. 6 is a cross-sectional view of an example of a redistribution layer, according to some embodiments.

FIG. 6 is a cross-sectional view of an example of a redistribution layer according to some embodiments. Semiconductor dies 101 and 102 are disposed in a face-to-face configuration with interposer 103 located between them. Die 101 includes pad 201 to be coupled to pad 202 of die 102 through redistribution layer 601. Particularly, redistribution bus 501 is coupled to pad 201 to form pad area 301, and also forms pad area 502 at an opposite die edge from where original pad 201 is located.

Redistribution layer 601 also includes first dielectric layer 603 and second dielectric layer 604, between which redistribution bus 501 is disposed. In some cases, dielectric layers 603 and 604 may include any suitable passivation or dielectric materials, such as polyimide or the like. Solder sphere 105 is deposited within edge detent 104 of interposer 103 to electrically couple pad area 502 on die 101 to pad 202 of die 102.

Accordingly, in some embodiments, one of dies 101 or 102 may include a redistribution layer. It should be understood, however, that in other embodiments each of dies 101 and 102 may include its own redistribution layer. For example, die 101 may include a first redistribution layer relocating certain pads around the surface of die 101, and die 102 may include a second redistribution layer relocating other pads around the surface of die 102. Also, in some implementations, a passivation layer may be placed over die pads 201 and/or 202 to keep solder 105 from shorting over the edge of the die to the silicon substrates 101 and/or 102.

Figure 7:
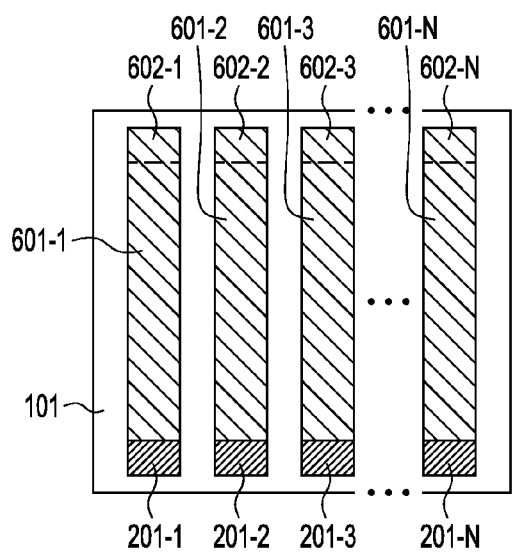
FIGS. 7 and 8 are diagrams illustrating examples of redistribution buses, according to some embodiments.
Figure 8:
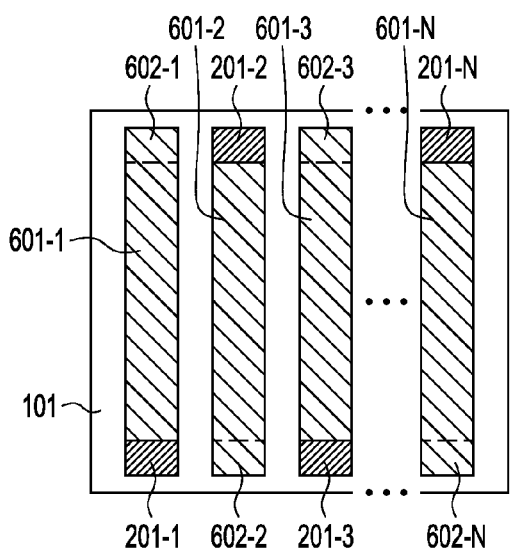

FIGS. 7 and 8 are diagrams illustrating examples of redistribution buses according to some embodiments. In FIG. 7, buses 601-1 through 601-N are shown redistributing pads 201-1 through 201-N from one edge of die 101 to pad areas 602-1 through 602-N at an opposite edge of die 101. In FIG. 8, odd-numbered buses 601-1, 601-3, etc. relocate pads 201-1, 201-3, etc. from a first edge of die 101 to a second edge of die 101, whereas even-numbered buses 601-2, 601-4, etc. relocate pads 201-2, 202-4, etc. from the second edge of die 101 to the first edge of die 101, the first and second edges being opposite from one another. In other implementations, however, other patterns may be used to relocate or redistribute pads on the surface of a semiconductor die.

In some embodiments, one or more of pads 201-1 through 201-N may be located in regions of die 101 other than its edge. For example, one or more such pads may be positioned near the center of die 101, in which case one or more vias may be provided through interposer 103 to allow those pads to be coupled to corresponding pads of die 102. Moreover, although buses 601-1 through 601-N are depicted as being straight lines, it should be noted that, in some cases, any one of such buses may include two or more line segments coupled to each other at any suitable angle.

Figure 10:
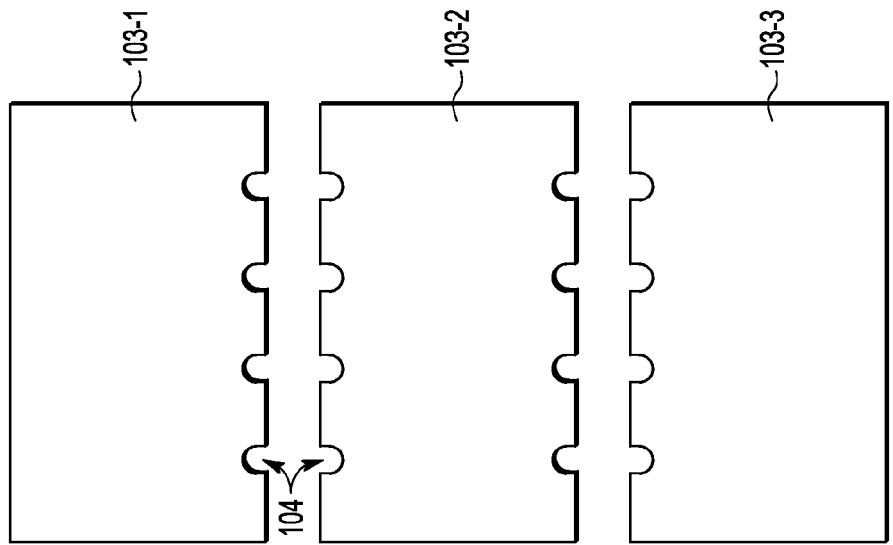
FIGS. 9 and 10 are diagrams illustrating examples of passive interposers with edge detents, according to some embodiments.
Figure 9:
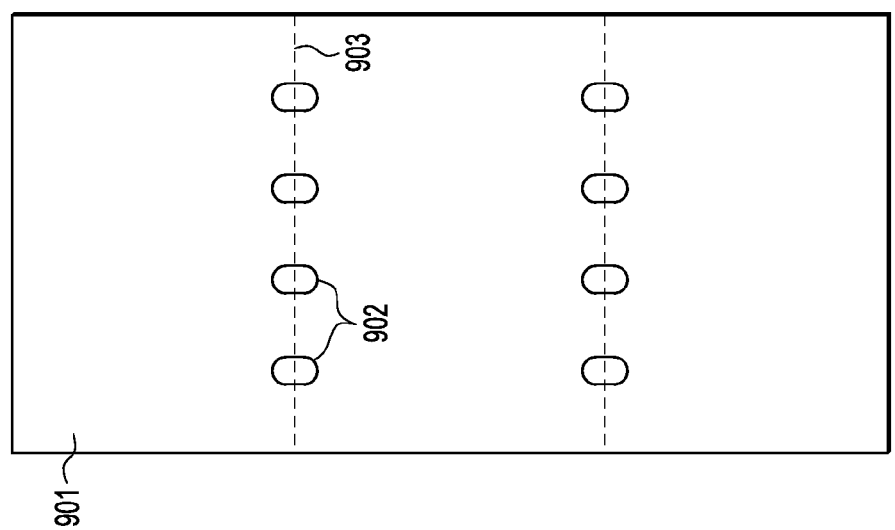

FIGS. 9 and 10 are diagrams illustrating examples of passive interposers with edge detents according to some embodiments. As shown, holes, vias, or slots 902 are made through passive interposer material 901 along dicing street 903. For instance, holes 902 may be made by mechanical drilling, etching, laser, ablation, etc. In some cases, holes 902 may be made by saw singulation. Also, holes 902 may have any suitable shape, such as a circular shape or an oval shape. For example, in some cases, holes 902 may each have a diameter of approximately 80 µm to 200 µm. When passive interposer material 901 is cut or diced along dicing street 903, it results in passive interposers 103-1 through 103-N having edge detents 104 at the perimeter of each such interposer.

In some embodiments, any number of edges of each interposer may include edge detents (e.g., passive interposer 103-2 has two edges with detents, whereas only one edge of passive interposer 103-1 includes such detents). In addition to edge detents 104, each passive interposer may also include one or more holes, vias, or slots located away from its edges and/or near its center to enable other die-to-die connections.

Figure 12:
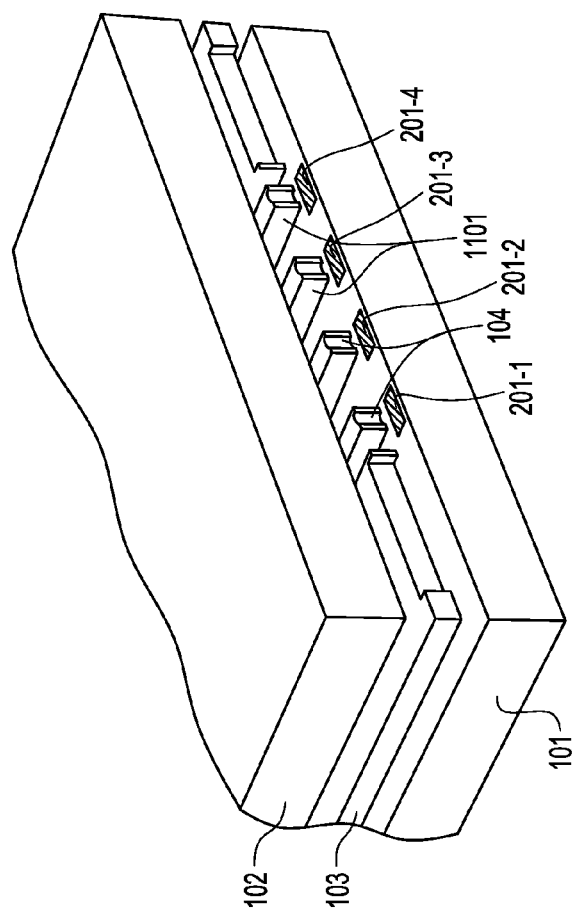
FIG. 12 is a diagram illustrating an example of a module using a lead frame interposer with edge detents, according to some embodiments.
Figure 11:
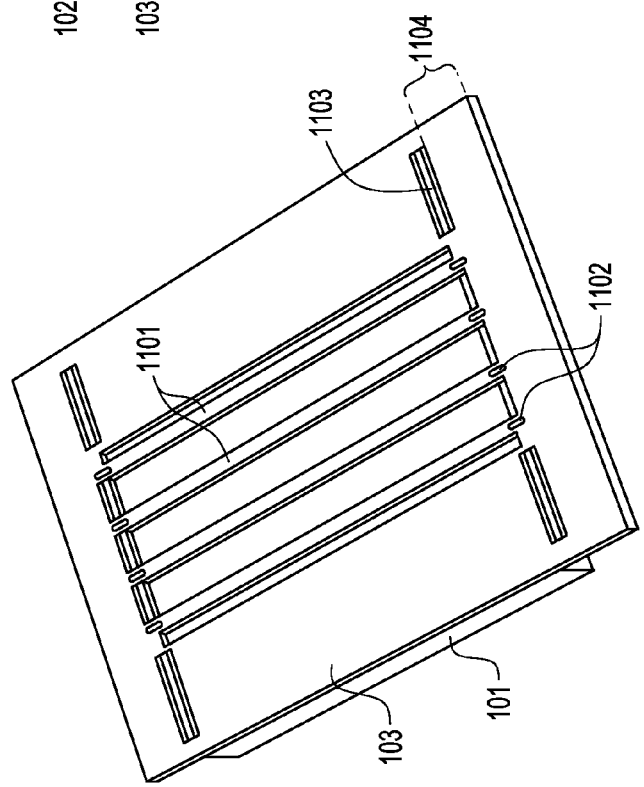
FIG. 11 is a diagram illustrating an example of a lead frame interposer with edge detents, according to some embodiments.

FIG. 11 is a diagram illustrating an example of a lead frame interposer with edge detents, according to some embodiments. As shown, lead frame 103 is disposed over semiconductor die 101. Particularly, lead frame 103 includes traces 1101 separated by spaces, each trace having two or more holes, vias, or slots 1102 located at the edge of semiconductor die 101, some of which may be aligned with pads (not shown) of die 101. "Tie" or "dam" bar portion 1104 overhangs beyond the edge of die 101, and slots 1103 may be used to further facilitate a singulation operation to remove excess lead frame and to expose edge detents 104, as shown in FIG. 12. It should be noted that, as was the case with passive interposers, here lead frame 103 may also include vias or holes at locations other than along the edge of die 101 to enable additional electrical connections.

FIG. 12 is a diagram illustrating an example of a module using a lead frame interposer with edge detents, according to some embodiments. As shown, die 102 is in a face-to-face configuration with respect to die 101, and lead frame 103 is disposed between dies 101 and 102. Once dam bar 1104 has been removed from lead frame 103, edge detents 104 are exposed and configured to capture solder balls in order to effect edge couplings between pads 201-1 through 201-4 in die 101 and corresponding pads in die 102 via traces 1101. For example, each of traces 1101 may connect a pad at one edge of die 101 to another pad at another—e.g., opposite or mirror—edge of die 102.

In some implementations, traces 1101 may include a conductive material, such as copper, aluminum, etc., whereas other portions of lead frame 103 may include dielectric or electrically insulating materials. In contrast with other embodiments shown above, here the use of a lead frame (instead of a passive interposer) may render the use of a redistribution layer unnecessary, given that traces 1101 may effect some (or all) electric interconnections between different pads on dies 101 and 102. In some embodiments, the spaces between traces 1101 may be filled with dielectric material or the like, for example, to help align detents 104 and/or to seal the active surfaces of dies 101 and 102.

Figure 13:
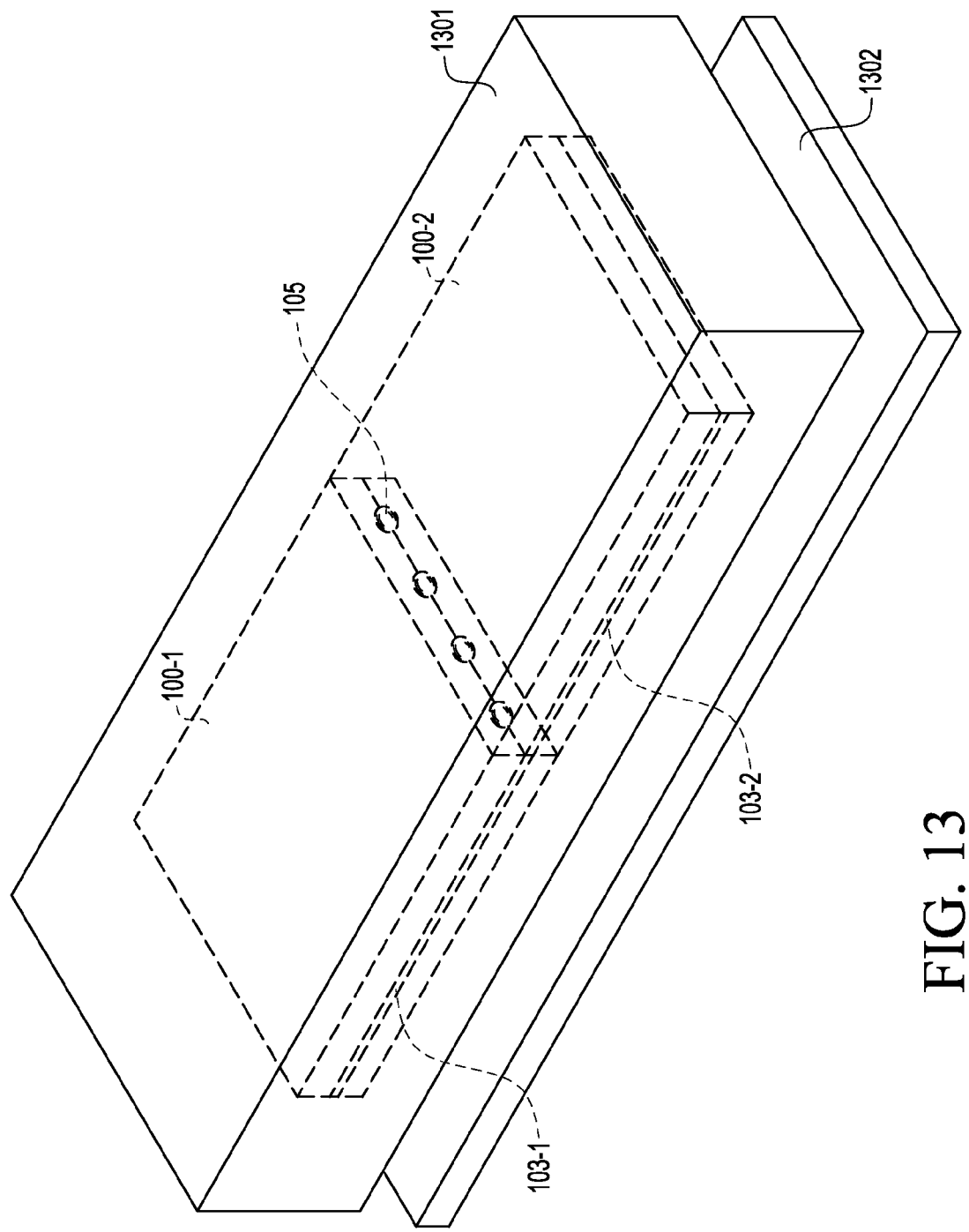
FIG. 13 is a three-dimensional, perspective view of an example of two edge-coupled modules horizontally assembled in a side-to-side configuration, according to some embodiments.

FIG. 13 is a three-dimensional, perspective view of an example of two edge coupled modules horizontally assembled in a side-to-side or planar configuration according to some embodiments. Particularly, module 100-1 is coupled to module 100-2 to form a two-dimensional or x-y array. Once coupled to one another through the use of solder balls 105 deposited within edge detents manufactured on interposers 103-1 and 103-2 as discussed herein, the entire array may be mounted on package substrate 1302 and encapsulated by encapsulant 1301 (e.g., an epoxy of the like) to result in a packaged device. As a result, module 100-2 is coupled to module 100-1 in a side-by-side configuration such that a first pad on a first semiconductor die and a second pad on a second semiconductor die (the first and second dies forming module 100-1), as well as a third pad on a third semiconductor die and a fourth pad on a fourth semiconductor die (the third and fourth dies forming module 100-2) are coupled together at the same, shared connection point.

Although only two modules are shown in FIG. 13, it should be understood that such a packaged device may include any number of modules, for example, to form a bus or the like.

Figure 14:
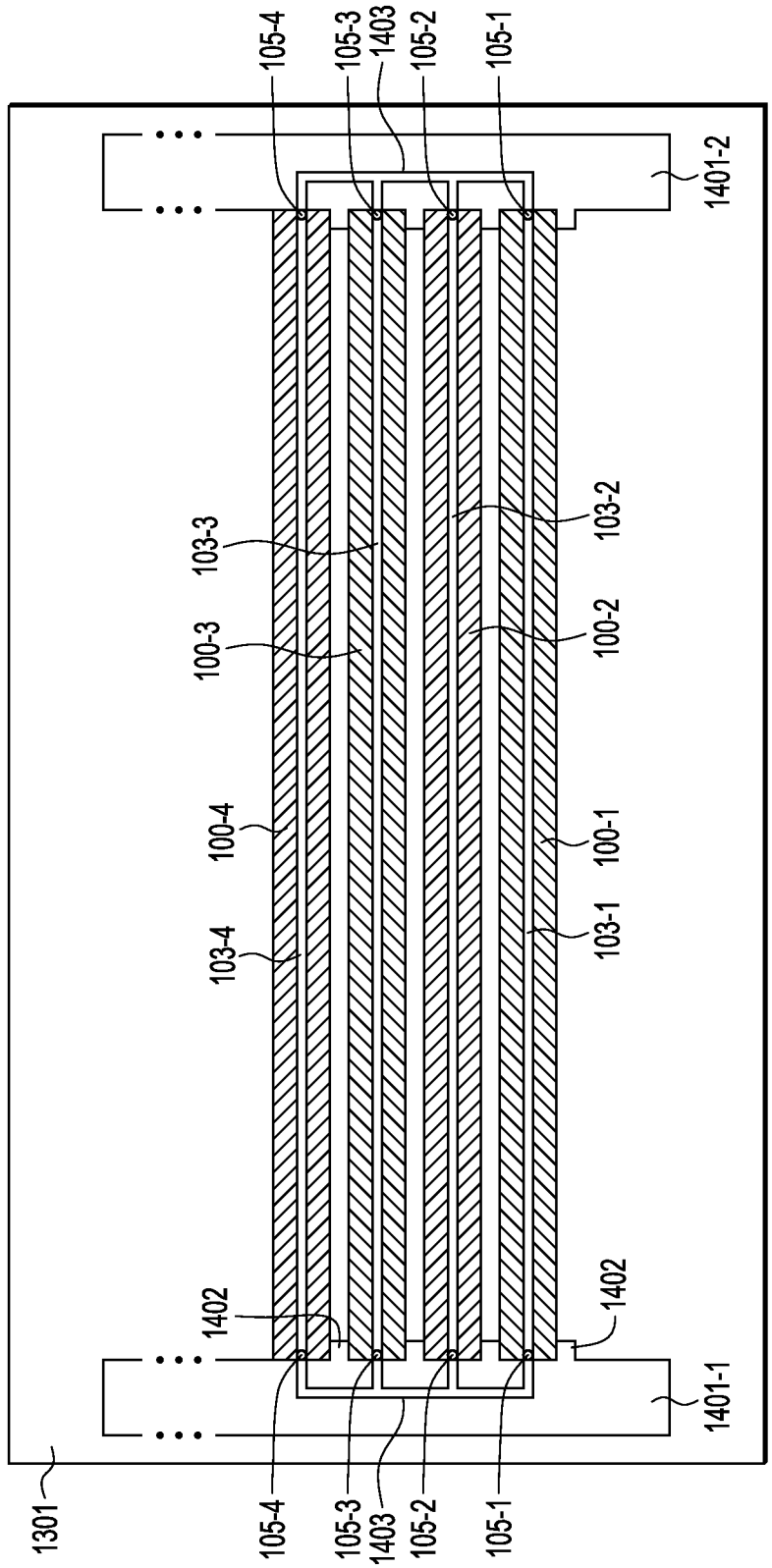
FIG. 14 is a cross-sectional view of an example of a device having a plurality of edge-coupled modules vertically assembled via a backplane, according to some embodiments.

FIG. 14 is a cross-sectional view of an example of a device having a plurality of edge-coupled modules vertically assembled via a backplane according to some embodiments. In this implementation, four modules 100-1 through 100-4 are suspended against backplanes 1401-1 and 1401-2 by notches 1402. Modules 100-1 through 100-4 are coupled to each other such that the edge couplings 105-1 through 105-4 on each side of each interposer 103-1 through 103-4, respectively, are coupled to corresponding electrical traces 1403 of backplanes 1401-1 and 1401-2. Also, in this implementation, modules 100-1 through 100-4 and backplanes 1401-1 and 1401-2 are all enveloped by encapsulant 1301. In other implementations, however, encapsulant 1301 may be absent. It will be understood that, in other embodiments, any number of modules 100-N may be vertically and/or horizontally assembled using backplanes 1401-1 and 1401-2. Moreover, in some cases only one of backplanes 1401-1 or 1401-2 may include traces 1403.

As described herein, in an illustrative, non-limiting embodiment, a semiconductor device may include a first semiconductor die, a second semiconductor die disposed in a face-to-face configuration with respect to the first semiconductor die, and an interposer arranged between the first semiconductor die and the second semiconductor die, the interposer having an edge detent configured to allow an electrical coupling between the first and second semiconductor dies. The edge detent may be aligned with respect to a first pad of the first semiconductor die and to a second pad of the second semiconductor die. For example, the electrical coupling may include solder.

In some cases, the first semiconductor die may include a redistribution bus configured to couple the first pad to a pad at a location corresponding to the second pad of the second semiconductor die. For instance, the redistribution bus may be a power bus, a ground bus, a clock bus, a memory read bus, or a memory write bus. The given location may be a mirror image of the original location. Additionally or alternatively, the first semiconductor die and the second semiconductor die may have the same topology.

In various implementations, the interposer may be a passive interposer including silicon, glass, or ceramic. Alternatively, the interposer may include a lead frame configured to couple the first pad to a pad at a different location of the first semiconductor die. For example, the lead frame may include copper, a copper alloy, alloy 42, or the like.

In another illustrative, non-limiting embodiment, a semiconductor device may include a first module having a first semiconductor die, a second semiconductor die disposed in a face-to-face configuration with respect to the first semiconductor die, and a first interposer arranged between the first semiconductor die and the second semiconductor die, the first interposer having one or more detents along the perimeter of the first interposer, each detent configured to allow an electrical coupling between the first and second semiconductor dies. The semiconductor device may further include a second module coupled to the first module, the second module having a third semiconductor die, a fourth semiconductor die disposed in a face-to-face configuration with respect to the third semiconductor die, and a second interposer arranged between the third semiconductor die and the fourth semiconductor die, the second interposer having one or more detents along the perimeter of the second interposer, each detent configured to allow an electrical coupling between the third and fourth semiconductor dies.

In some implementations, the second module may be coupled to the first module in a side-by-side configuration such that a first pad on the first semiconductor die, a second pad on the second semiconductor die, a third pad on the third semiconductor die, and a fourth pad on the fourth semiconductor die are coupled together with solder. Additionally or alternatively, the second module may be stacked over the first module, the first and second modules may be coupled to a backplane, and the backplane may include a bus configured to couple: (i) a first pad on the first semiconductor die and a second pad on the second semiconductor die to (ii) a third pad on the third semiconductor die and a fourth pad on the fourth semiconductor die.

In yet another illustrative, non-limiting embodiment, a method may include coupling a first semiconductor die to a surface of an interposer, where one or more edges of the interposer include a plurality of detents and the first semiconductor die includes a first pad aligned with a first detent, coupling a second semiconductor die to an opposite surface of the interposer, where the first and second semiconductor dies are in a face-to-face configuration and the second semiconductor die includes a second pad aligned with a second detent, and coupling the first pad to the second pad.

In some cases, coupling the first pad to the second pad may include depositing solder in the first and second detents. The first semiconductor die may include a redistribution bus configured to couple the first pad of the first semiconductor die to the second pad of the second semiconductor die. The given location may be a mirror image of the original location. The redistribution bus may be a power bus, a ground bus, a clock bus, a read bus or a write bus. The first semiconductor die and the second semiconductor die may have the same topology. Moreover, the interposer may be made of a dielectric material or it may include a lead frame.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 15:
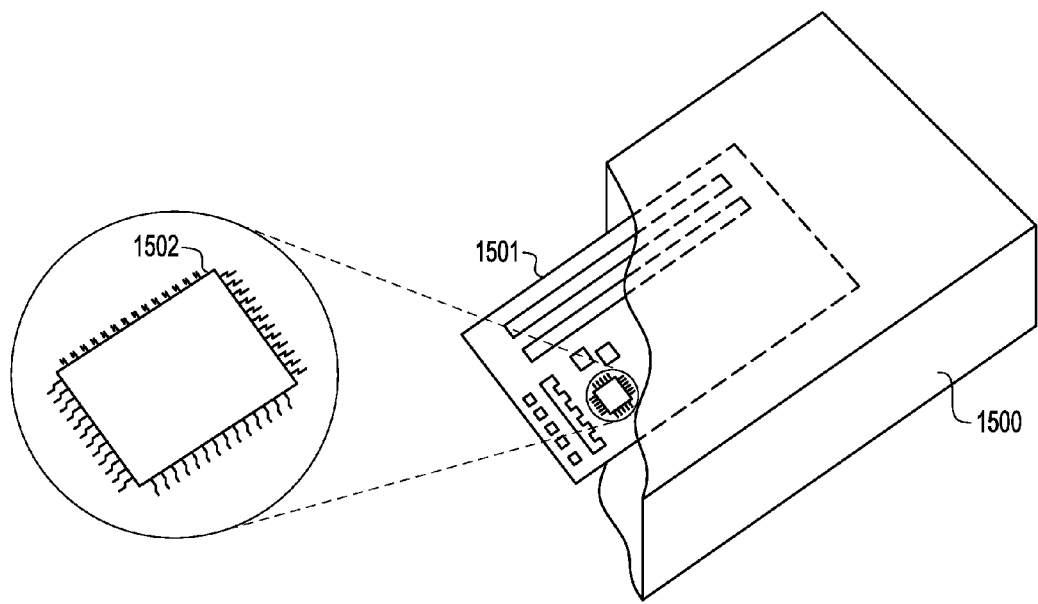
FIG. 15 is a diagram of an example of an electronic device having one or more electronic microelectronic device packages, according to some embodiments.

Turning to FIG. 15, a block diagram of electronic device 1500 is depicted. In some embodiments, electronic device 1500 may be any of the aforementioned electronic devices, or any other electronic device. As illustrated, electronic device 1500 includes one or more Printed Circuit Boards (PCBs) 1501, and at least one of PCBs 1501 includes one or more microelectronic device packages(s) 1502. In some implementations, device package(s) 1502 may include one or more edge coupled semiconductor dies discussed above.

Examples of device package(s) 1502 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 1502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 1502 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 1502 may include one or more Micro-ElectroMechanical Systems (MEMS), Nano-Electro-Mechanical Systems (NEMS), or the like.

Generally speaking, device package(s) 1502 may be configured to be mounted onto PCB 1501 using any suitable packaging technology such as, for example, Ball Grid Array (BGA) packaging or the like. In some applications, PCB 1501 may be mechanically mounted within or fastened onto electronic device 1500. It should be noted that, in certain implementations, PCB 1501 may take a variety of forms and/or may include a plurality of other elements or components in addition to device package(s) 1502. It should also be noted that, in some embodiments, PCB 1501 may not be used and/or device package(s) 1502 may assume any other suitable form (s).

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor device, comprising:
   a first semiconductor die;
   a second semiconductor die disposed in a face-to-face configuration with respect to the first semiconductor die; and
   an interposer sandwiched between a first adhesive layer disposed on a bottom surface of the first semiconductor die and a second adhesive layer disposed on a top surface of the second semiconductor die, wherein the interposer has having an edge detent located at an outermost perimeter of the interposer, wherein the first adhesive layer is separated from a first pad on the bottom surface of the first semiconductor die by a first passivation component, wherein the second adhesive layer is separated from a second pad on the bottom surface of the second semiconductor die by a second passivation component, and wherein the edge detent is configured to receive a solder ball to allow an electrical coupling between corresponding electrical terminals on the first and second semiconductor dies without the use of bondwires between the corresponding electrical terminals.

2. The semiconductor device of claim 1, wherein the edge detent is aligned with respect to the first pad of the first semiconductor die and to the second pad of the second semiconductor die.

3. The semiconductor device of claim 2, wherein the first semiconductor die includes a redistribution bus configured to couple the first pad to a pad at a location corresponding to the second pad of the second semiconductor die.

4. The semiconductor device of claim 3, wherein the given location is a mirror image of the original location.

5. The semiconductor device of claim 3, wherein the redistribution bus is configured to conduct at least one power signal, at least one clock signal, at least one memory read signal, or at least one memory write signal.

6. The semiconductor device of claim 1, wherein the first semiconductor die and the second semiconductor die have the same topology.

7. The semiconductor device of claim 1, wherein the interposer is a passive interposer including silicon, glass, or ceramic.

8. The semiconductor device of claim 1, wherein the interposer includes a lead frame configured to couple the first pad to a pad at a different location of the first semiconductor die.

9. A semiconductor device, comprising:
   a first module including:
      a first semiconductor die;
      a second semiconductor die disposed in a face-to-face configuration with respect to the first semiconductor die; and
      a first interposer sandwiched between a first adhesive layer disposed on a bottom surface of the first semiconductor die and a second adhesive layer disposed on a top surface of the second semiconductor die, wherein the first interposer has one or more detents along the outermost perimeter of the first interposer, wherein the first adhesive layer is separated from a first pad on the bottom surface of the first semiconductor die by a first passivation component, wherein the second adhesive layer is separated from a second pad on the bottom surface of the second semiconductor die by a second passivation component, and wherein each detent is configured receive a solder ball to allow an electrical coupling between corresponding electrical terminals on the first and second semiconductor dies without the use of bondwires between the corresponding electrical terminals; and
   a second module coupled to the first module, the second module including:
      a third semiconductor die;
      a fourth semiconductor die disposed in a face-to-face configuration with respect to the third semiconductor die; and
      a second interposer sandwiched between the third semiconductor die and the fourth semiconductor die, the second interposer having one or more detents along the outermost perimeter of the second interposer, each detent configured to allow an electrical coupling between the third and fourth semiconductor dies.

10. The semiconductor device of claim 9, wherein the second module is coupled to the first module in a side-by-side configuration such that a first pad on the first semiconductor die, a second pad on the second semiconductor die, a third pad on the third semiconductor die, and a fourth pad on the fourth semiconductor die are coupled together directly via the solder ball without the use of bondwires.

11. The semiconductor device of claim 9, wherein the second module is stacked over the first module, wherein the first and second modules are coupled to a backplane, and wherein the backplane includes a bus configured to couple, via the solder ball and without the use of bondwires: (i) a first pad on the first semiconductor die and a second pad on the second semiconductor die to (ii) a third pad on the third semiconductor die and a fourth pad on the fourth semiconductor die.

* * * * *